United States Patent [19]
Ewen et al.

[11] Patent Number: 5,446,311
[45] Date of Patent: Aug. 29, 1995

[54] HIGH-Q INDUCTORS IN SILICON TECHNOLOGY WITHOUT EXPENSIVE METALIZATION

[75] Inventors: John E. Ewen, Yorktown Heights; Saila Ponnapalli, Fishkill; Mehmet Soyuer, Yorktown Heights, all of N.Y.

[73] Assignee: International Business Machines Corporation, Armonk, N.Y.

[21] Appl. No.: 307,953

[22] Filed: Sep. 16, 1994

[51] Int. Cl.[6] ............... H01L 27/02; H01L 23/48
[52] U.S. Cl. ..................... 257/531; 257/508; 257/758; 257/774; 257/776; 336/12; 336/65; 336/107; 336/138; 336/173; 336/186; 336/223; 336/225
[58] Field of Search ............ 257/528, 531, 508, 758, 257/774, 776; 336/12, 65, 107, 138, 173, 186, 223, 225

[56] References Cited

U.S. PATENT DOCUMENTS

| | | |
|---|---|---|
| 4,418,470 | 12/1983 | Naster et al. . |
| 4,648,087 | 3/1987 | Scranton et al. . |
| 4,797,785 | 1/1989 | Jorgensen ............... 361/402 |
| 5,070,317 | 12/1991 | Bhagat . |
| 5,095,357 | 3/1992 | Andoh et al. . |
| 5,227,659 | 7/1993 | Hubbard . |
| 5,279,988 | 1/1994 | Saadat et al. . |
| 5,396,101 | 3/1995 | Shiga ...................... 257/531 |

FOREIGN PATENT DOCUMENTS

| | | | |
|---|---|---|---|
| 3-19358 | 1/1991 | Japan ................... 257/531 |
| 5-82786 | 4/1993 | Japan ................... 257/531 |

*Primary Examiner*—Ngân V. Ngô
*Attorney, Agent, or Firm*—Whitham, Curtis, Whitham & McGinn; Robert Tassinari

[57] ABSTRACT

A monolithic high-Q inductor structure is formed with multiple metalization levels in a conventional integrated circuit technology in which inductor turns utilize these multiple levels to reduce the inductor resistance. Inductors with Q values above five can be integrated with this approach at radio and microwave frequencies.

4 Claims, 3 Drawing Sheets

HIGH-Q INDUCTORS IN SILICON TECHNOLOGY WITHOUT EXPENSIVE METALIZATION

BACKGROUND OF THE INVENTION

1. Field of the Invention

The present invention generally relates to the design and construction of electrical inductors and, more particularly, to a novel monolithic inductor structure which is compatible with a low-cost silicon technology.

2. Description of the Prior Art

Miniaturization of electronic circuits is a goal in virtually every field, not only to achieve compactness in mechanical packaging, but also to decrease the cost of manufacture of the circuits. Many digital and analog circuits, including complex microprocessors and operational amplifiers, have been successfully implemented in silicon based integrated circuits (ICs). These circuits typically include active devices such as bipolar transistors and field effect transistors (FETs), diodes of varies types, and passive devices such as resistors and capacitors.

One area that remains a challenge to miniaturize are radio frequency (RF) circuits, such as those used in cellular telephones, wireless modems, and other types of communication equipment. The problem is the difficulty in producing a good inductor in silicon technologies that is suitable for RF applications. Attempts to integrate inductors into silicon technologies have yielded either inductor Q values less than five or required special metalization layers such as gold.

It is well known that the direct current (DC) resistance of a metal line that forms a spiral inductor is a major contributor to the inductor Q degradation. One way to reduce this effect is to use wide metal linewidths, however, this increases the inductor area and the parasitic capacitance associated with the structure. The larger inductor area limits the miniaturization that can be achieved, and the parasitic capacitance associated with the larger area decreases the self-resonance frequency of the inductor, thereby limiting its useful frequency range. Also, since the Q is directly proportional to frequency and inversely proportional to the series loss of the inductor, the metal line widths cannot be chosen arbitrarily large.

SUMMARY OF THE INVENTION

It is therefore an object of the present invention to provide a novel monolithic high-Q inductor structure in silicon technology.

According to the invention, there is provided a high Q inductor structure formed with multiple metalization levels in a conventional integrated circuit technology in which inductor turns utilize these multiple levels to reduce the inductor resistance. Inductors with Q values above five can be integrated with this approach at radio and microwave frequencies.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
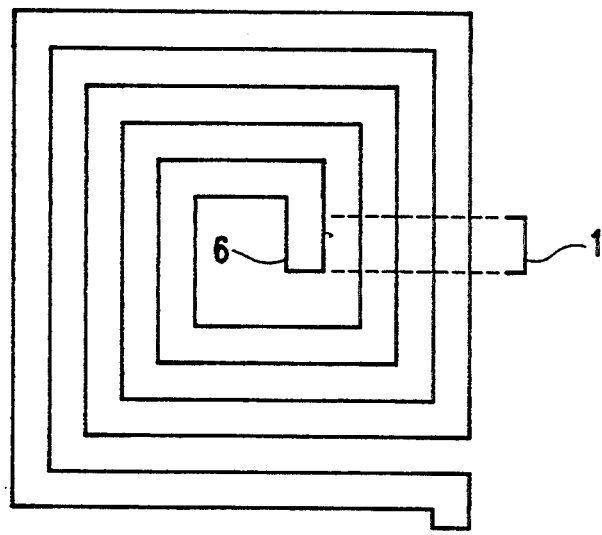
FIG. 1 is a plan view of a spiral inductor structure with three levels of metal according to the invention.
Figure 2:
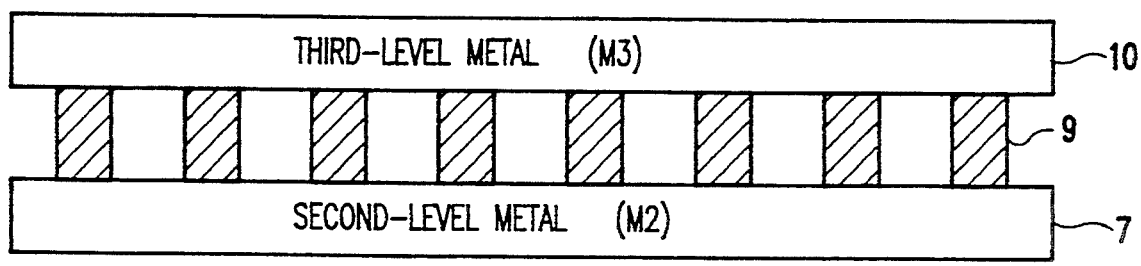
FIG. 2 is a cross section of a spiral line segment.
Figure 3:
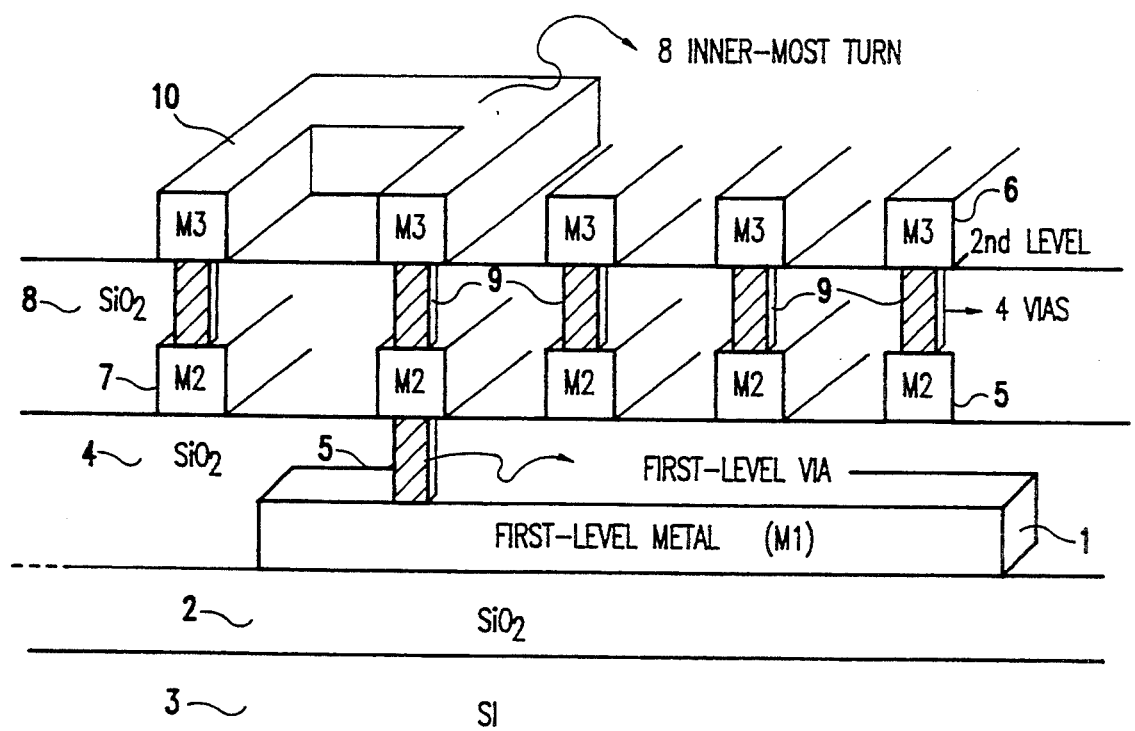
FIG. 3 is a cross-section of inductor showing the cross-under design used to connect to the center terminal of spiral.

Referring now to the drawings, and more particularly to FIG. 1, there is shown a plan view of the spiral inductor structure according to the preferred embodiment of the invention. As shown in FIGS. 2 and 3, this structure has three levels of metal, the first metal level 1 being the first level above a layer silicon oxide 2 on a silicon substrate 3. See FIG. 3. The first metal level 1 is covered by a second layer of silicon dioxide 4 through which a via 5 is formed. The first metal level 1 is used as a cross-under to make connection to the central terminal 6 (FIG. 1) of the spiral structure. The via 5 is filed with a metal to interconnect the first level with the second metal level 7. This next level 7 is covered by a third silicon dioxide layer 8 having a plurality of vias 9 formed therein. As shown in FIG. 2, the vias 9 are filled with a metal to interconnect the second metal level 7 to a third metal level 10. The two metal levels 7 and 10 are identical spiral metal patterns, as shown in FIGS. 1 and 3, and the vias 9 effectively shunt the two metal levels. Thus, two layers are used for inductor turns, and these two layers provide two inductors connected in parallel to reduce DC resistance. The reduction in DC resistance for a two layer inductor is at least a factor of two, hence providing a large Q enhancement. Obviously, the DC resistance can be further decreased by shunting more metal layers if extra wiring levels are offered by the technology.

This approach solves the problem of inductor design for high frequency (into the GHz range) applications by employing multiple layers of metal connected with via holes through the isolation levels. Most of the silicon technologies at present have at least three or more metal layers for wiring the circuits. The first metal level has to be used as a cross-under to make a connection to the circled terminal of the spiral structure, as shown in FIG. 1, thus leaving at least two layers to be used for the inductor turns. This invention has been implemented in hardware using a mature BiCMOS (bipolar/complementary metal oxide semiconductor) technology.

Figure 4:
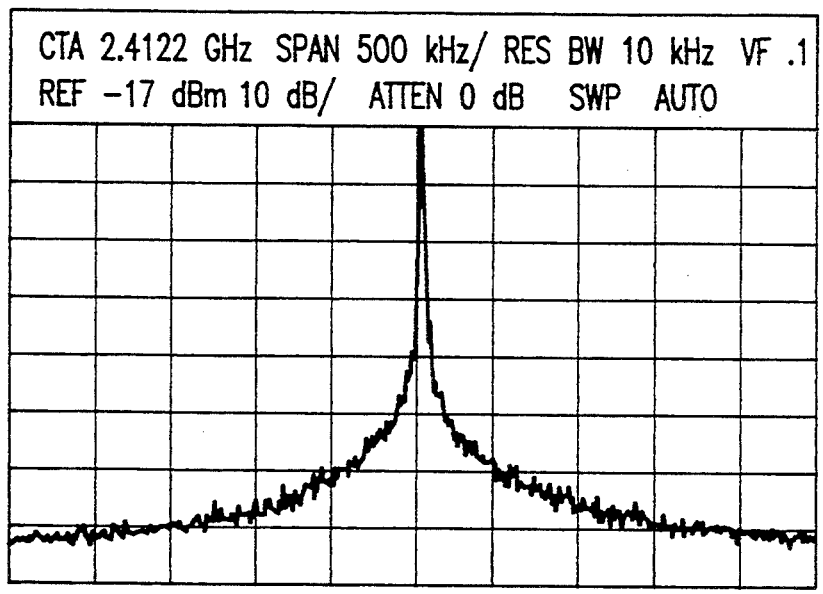
FIG. 4 is a graph showing the frequency spectrum of an oscillator using the inductor shown in FIGS. 1, 2 and 3.

In a specific example, the measured Q of a four-turn spiral inductor was at least seven at 2.4 Ghz. This inductor uses two metal levels to implement the turns and a third one for the cross under. The inductor performed well as part of a resonator in a 2.4 GHz Colpitts bipolar oscillator, as shown in FIG. 4.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A high Q monolithic inductor structure formed using a conventional silicon technology comprising at least first and second metal levels separated from one another by a first insulating layer, said first and second metal levels being formed with identical spiral patterns and connected through via holes in the first insulating layer to implement parallel connected turns of the inductor structure having a low resistance value.

2. A high Q monolithic inductor structure as recited in claim 1 further comprising a third metal level formed on a second insulating layer over a silicon substrate, said third metal level having a pattern which crosses under the spiral patterns of said first and second metal levels and is connected to one terminal of the inductor structure, one of said first and second metal levels being connected to a second terminal of the inductor and said second metal level being separated from said third metal level by a third insulating layer and connected at a central portion of said spiral pattern by a via hole through the third insulating layer to said third metal level.

3. The monolithic high Q inductor structure recited in claim 2 wherein said first, second and third insulating layers are silicon dioxide.

4. The monolithic high Q inductor structure recited in claim 3 wherein said the inductor structure has a Q value of seven or more at the 2.4–2.5 GHz band.

* * * * *